United States Patent [19]

Fickett et al.

[11] Patent Number: 4,982,783
[45] Date of Patent: Jan. 8, 1991

[54] SELF-TIGHTENING HEAT SINK

[75] Inventors: Robert A. Fickett, San Jose; Gordon R. Lavering, Belmont, both of Calif.

[73] Assignee: Varian Associates, Inc., Palo Alto, Calif.

[21] Appl. No.: 274,879

[22] Filed: Nov. 12, 1988

[51] Int. Cl.⁵ .............................................. F28F 7/00
[52] U.S. Cl. ................................ 165/80.1; 165/80.2; 165/80.3; 165/185
[58] Field of Search ........................... 165/80.1–80.3, 165/185; 174/16.3; 361/386

[56] References Cited

U.S. PATENT DOCUMENTS

| | | | |
|---|---|---|---|
| 2,879,977 | 3/1959 | Trought | 165/80.3 |
| 2,917,286 | 12/1959 | Deakin | 174/16.3 X |
| 3,146,384 | 8/1964 | Ruehle | 165/80.3 X |
| 3,195,628 | 7/1965 | McAdam | 165/185 |
| 3,213,336 | 10/1965 | McAdam | 165/80.3 X |
| 3,480,078 | 11/1969 | Jäger | 165/185 |
| 4,483,389 | 11/1984 | Balderes et al. | 165/80.3 |
| 4,716,494 | 12/1987 | Bright et al. | 361/386 |

Primary Examiner—Martin P. Schwadron
Assistant Examiner—Allen J. Flanigan
Attorney, Agent, or Firm—Stanley Z. Cole; David Schnapf

[57] ABSTRACT

A heat sink element, preferably one formed with a relatively large surface area from which thermal energy can be transferred convectively and radiatively to an ambient atmosphere, with or without forced fluid flow, is held forcibly in contact with a heat transmitting surface of a heat source for thermal conduction of heat therefrom. A heat sink attachment element affixed to the heat sink element has flexibly attached castellated extensions formed with tapered end teeth contacting a correspondingly inclined surface of the heat source. The castellated extensions are each subjected to a continual externally applied force and the total resultant force thereof, holding the heat sink element to the heat source, thereby can be maintained or will increase as the assembly experiences thermal cycling and mechanical disturbances during use. The effectiveness of thermally conductive contact between the heat sink and heat source therefore does not deteriorate during prolonged use.

22 Claims, 6 Drawing Sheets

SELF-TIGHTENING HEAT SINK

FIELD OF THE INVENTION

This invention relates to a heat sink unit, of a type attachable to a hot body such as an electronic component to remove by conduction heat being generated therewithin and, more particularly, to a heat sink unit that self-tightens so as to increase the force of attachment to enhance transfer of heat from the hot body during the course of its use.

BACKGROUND OF THE INVENTION

There are numerous electronic components which, during use, become heated, i.e., act as "heat sources", in response to internal electric power dissipation. Solid state and other current-carrying devices generate internal heat during use. If the heat is not promptly removed, the device's internal temperature rises to unacceptable levels at which thermally induced failure may occur. Where such devices are used in expensive or defense-related equipment, it is extremely important to avoid such failures. There is, therefore, a need for heat sink units attachable to such devices to continually remove heat generated therein and to dissipate it to the ambient atmosphere. Optionally, such devices include means for directing a flow of air or other suitable fluid at or past the heat source and the attached heat sink unit.

Preferably, heat is continuously removed by thermal conduction from at least a portion of such a heat source. The heat is removed by intimate contact between a portion of the heat sink unit and a corresponding portion of the heat source, and the thermally conducted heat must then be removed from the heat sink unit. Heat removal from the heat sink can be efffected by known techniques, e.g., by radiation, by free or forced gas convection, or by free or forced liquid convection.

Typically, a heat exchanger surface is attached in a conventional manner to an outermost surface of the heat source and, during use, acts as a thermal transformer. In essence, the heat exchanger surface transforms the problem of removing heat from a high power density condition at a first surface (as at a surface of the heat producing device) to removing heat from a second surface having a lower power density (as at the relatively large surface area of the heat exchanger exposed to the ambient atmosphere). Such a thermal transformation reduces the power density at the final heat dissipating surface to a level that can be handled, especially where convection is relied upon, at reasonable, slower coolant velocities for any ambient coolant flow contacting the final cooling surface.

Quite apart from the fundamental problem of how to attach a heat sink unit to a heat source in the present context, the degree of contact obtainable between the heat source surface and the heat sink surface across the contact interface is known to be highly dependent on the "actual" contact surface area as distinguished from the "nominal" contact or interface area of the two abutting bodies. One known solution for facilitating heat conduction between the abutting interface surfaces is to insert a thermally conductive deformable material between them. Such a material may, for example, be a conductive paste, commonly known as a "heat sink compound", that is applied as a very thin layer at the interface between the contacting surfaces. While this is helpful, it has been found that increasing the compressive force with which the heat sink and the heat source surfaces make contact at the interface increases the "actual" contact area significantly and that this has a much more pronounced effect on the rate at which heat is transferred across a nominal unit area of the interface.

Numerous configurations have been attempted to forcibly clamp or otherwise hold together a heat sink unit to a heat source. A common problem, however, is that most such devices undergo thermal cycling and possibly vibration or mechanical shock during use. In normal use of the known structures, the force that holds a heat sink unit to a heat source generally decreases with time. Incidental trauma suffered by a cooled device during use, in the known art, has a tendency to reduce heat transfer efficiency of the device.

There is, therefore, a definite need for an improved heat sink unit that can be forcibly attached to a heat source, wherein the heat sink unit, during use of the device, grips the heat source with increasing force as the combination is subjected to thermal and mechanical shock, vibration, or other incidental experiences during use.

DISCLOSURE OF THE INVENTION

Accordingly, it is an object of this invention to provide a heat sink unit that may be attached to a heat transfer surface of a heat source to effectively transfer heat from the surface over prolonged use including thermal cycling and incidental mechanical force inputs.

It is another object of this invention to provide a self-tightening heat sink unit that is readily attachable to a heat transfer surface of a heat source and which, during normal use, enhances the transfer of heat from the heat source to the heat sink.

It is another related object of this invention to provide a heat sink unit that is readily attachable to a heat transfer surface of a heat source in such a manner that thermal cycling, vibration and other incidental forces imparted to the source and sink cause the heat sink unit to be more firmly held in position on the heat source to promote increased heat transfer between them.

It is a related object of this invention to provide a heat sink unit that is readily attachable to a heat source to transfer heat therefrom for dissipation to an ambient atmosphere that, optionally, may include forced coolant fluid flow.

It is a further related object of this invention to provide a self-tightening heat sink unit that is readily attachable to a heat source to transfer heat therefrom, wherein the heat sink unit comprises only nonmagnetic materials.

It is an even further object of this invention to provide apparatus for holding a heat sink element in firm contact with a heat transfer surface of a heat source in a manner such that the force holding the heat sink element to the heat source can only increase as a consequence of thermal cycling, mechanical vibrations and other incidentals of normal use of the combination.

These and other objects of this invention are realized in a self-tightening heat sink unit attachable to a correspondingly formed heat transfer portion of a hot body to receive heat therefrom. The heat sink unit includes a heat sink element having a first surface for making thermally conductive forcible contact with the hot body at a corresponding first contact surface thereof to conductively receive heat therefrom. A contact forcing means is provided and exerts a forcible contact between the heat sink element and the hot body in response to a compressive force acting between the heat sink element first surface and the hot body first contact surface. The contact forcing means also continually acts during use of the heat sink unit to increase the compressive force holding the heat sink unit to the hot body.

In another aspect of this invention, a self-tightening attachment contacts a heat receiving surface of a heat sink element to a corresponding heat transmitting surface of a heat source so that conductive heat transfer between them only increases a first contact force between these heat transfer surfaces when the attachment is subjected to in-use experiences that include thermal cycling, extraneous mechanical vibrations and the like. The attachment includes a first end portion suitable for attachment to a heat sink element outside of the heat receiving surface thereof, an intermediate portion extending in a direction substantially normal to said first end portion toward an attachment portion of the heat source, an end portion connected to the intermediate portion and formed to contact the attachment portion of the heat source at a surface thereof which is inclined at a predetermined acute angle with respect to the heat transmitting surface of the heat source, and self-tightening means for continually applying a tightening force to the intermediate portion. The structure causes the end portion to maintain a second contact force at the inclined surface. The second contact force irreducibly generates the first contact force which holds the heat receiving and heat transmitting surfaces in mutual thermally conductive contact.

Still other objects and advantages of the present invention will become apparent to those skilled in the art from the following detailed description, wherein only the preferred embodiments of this invention are disclosed in detail simply by way of illustration of the best modes contemplated for carrying out the invention. As will be appreciated, this invention is amenable to other and different embodiments, and its several details are capable of modification in various obvious respects, all without departing from the invention. Accordingly, the drawing and description are to be regarded as illustrative and not restrictive in nature.

DESCRIPTION OF THE PREFERRED EMBODIMENTS

Figures 1, 2:
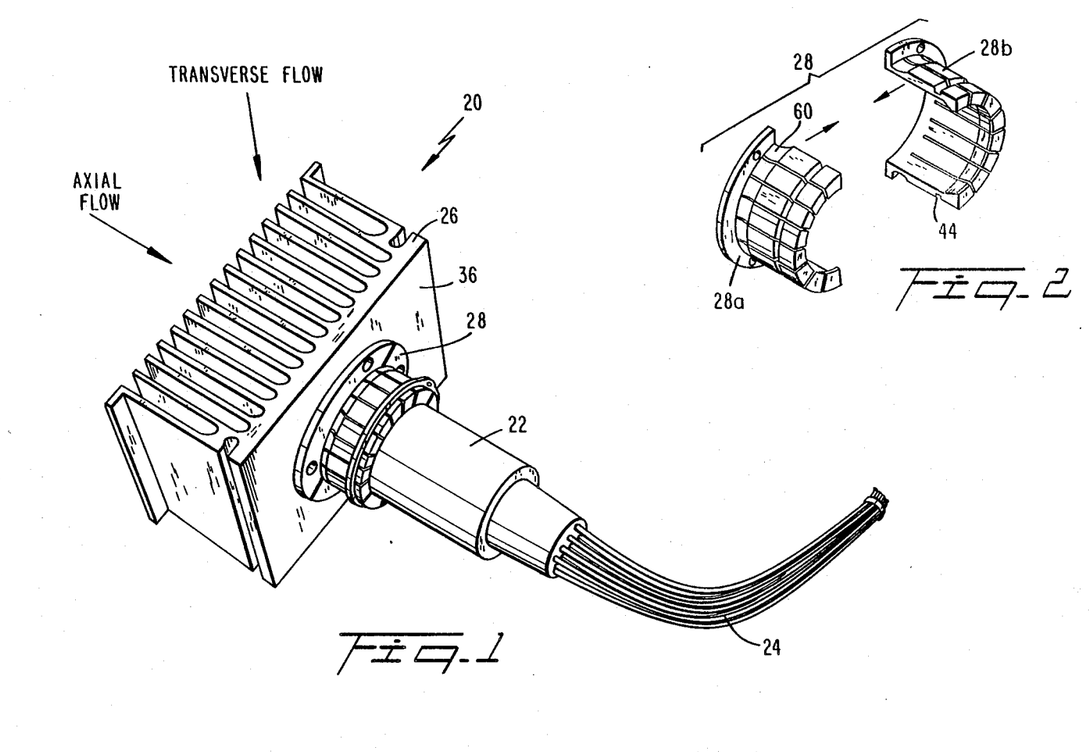
FIG. 1 is a perspective view of an electronic component, such as a portion of a planar tridde, to which is attached a self-tightening heat sink unit according to a preferred embodiment of the present invention.
FIG. 2 is a perspective view of the disassembled principal components forming a self-tightening heat sink attachment according to a preferred embodiment of this invention.

Many solid state devices and other current carrying elements in sensitive circuits generate considerable amounts of thermal energy during operation. If this thermal energy is not continually removed, it can lead to internal temperature levels that may interfere with proper operation or, in extreme cases, even cause operational destruction of the device. As best seen in FIG. 1, assembly 20 incorporating a preferred embodiment of the present invention includes a typical heat producing electrical circuit element such as a planar triode anode 22 having a large copper core which is supplied with electrical power by attached cable 24. Heat sink element 26 is attached at one end of anode 22, and is forcibly held thereat by a self-tightening heat sink attachment element 28. Element 28, in use, is typically subjected to thermal cycling, incidental mechanical vibrations and other extraneous forces.

As best seen in the perspective view of the assembly of FIG. 1 and FIGS. 3 and 4, a heat producing device such as an anode, referred to hereinafter as the "heat source 22", typically but not always has a generally cylindrical form with a planar end surface 30. In the preferred embodiment, illustrated in perspective in FIG. 2, the self-tightening heat sink attachment element 28 is conveniently formed in two symmetrical similar halves 28a and 28b that are affixable by any known means, e.g., screws 32 threaded into internally threaded apertures 34 provided therefor, at a base surface 36 of the heat sink element 26. When the elements are assembled as illustrated in FIG. 1, conductive thermal contact is established between face 30 of heat source 22 and a surface 38, hereinafter referred to as the "heat sink contact surface 38", within the zone defined by the threaded screw-receiving apertures 34.

Persons skilled in the art will immediately appreciate that although it is not necessary to form the self-tightening attachment element 28 in any particular number of parts, if it is in fact formed into two parts 28a and 28b as illustrated in FIG. 2, one of the parts may first be screwed to base 36 of heat sink element 26 and that much of the assembly placed so that heat source surface 30 and heat sink contact surface 28 are in contact with each other and the element 28a engages groove 40. The other half, i.e., 28b, of the self-tightening attachment is then placed oppositely of portion 28a and is itself screwed into base 36 so as to also engage the other side of groove 40. A spring clip 42, best seen in FIGS. 7 and 8 and more fully described hereinafter, is then placed to engage the outside of self-tightening elements 28a and 28b at locator grooves 44 provided therein. Any radially tightening device that can fit in the same manner as exemplary spring clip 42 at locator groove 44 would also be acceptable. The coaction of attachment elements 28a and 28b with spring clip 42 engaging groove 40 is thus responsible for generating a resultant contact force to facilitate thermal conduction of heat from heat source 22 to heat sink element 26. In the unique and particular advantage offered by the present invention, this ensures that this force not only does not reduce when the assembly is subjected to thermal cycling, mechanical vibration and the like but, instead, that the heat sink element is held even more forcibly to heat source 22 due to such in-use experiences, i.e., there is a ratcheting effect tending to increase the resultant force.

Figure 3:
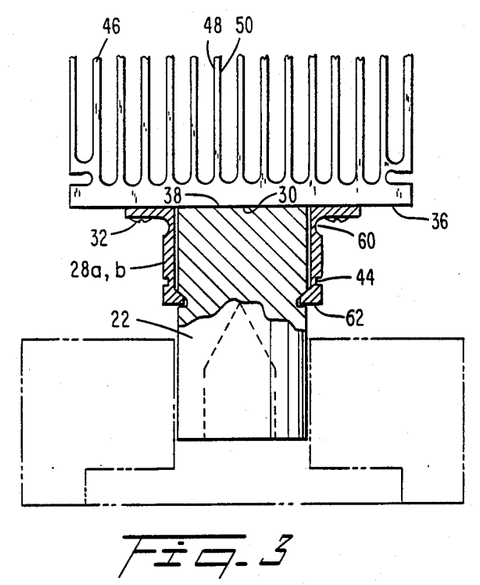
FIG. 3 is a partial vertical cross-sectional view of a self-tightening heat sink unit, according to a preferred embodiment of this invention, attached to a generally cylindrical heat source.

Referring now to FIGS. 1, 2 and 3, it is seen that a very convenient form for heat sink element 26 includes a base portion having a base surface 36 (which includes at a suitable location and to a suitable size and finish a heat sink contact surface 38) from which is extended a plurality of relatively thin fin-like elements offering a large surface area at which convection and radiation heat transfer may occur from the heat sink element to the ambient atmosphere. In FIG. 3, such fins 46 are shown as parallel, planar, substantially rectangular thin elements with surfaces 48 and 50 on opposite sides. As persons skilled in the art will immediately appreciate, it would be a relatively simple matter, by means of a fan or ducting, to generate a flow of ambient fluid approaching fins 46 along their planar dispositions, in what will hereinafter be referred to as "transverse" flow or, in the alternative, the flow may be directed towards the distal edges of fins 46 and toward their bases in what will hereinafter be referred to as the "axial" flow. One manner of effecting this is indicated in each of FIGS. 9b and 11b for transverse and axial flows, respectively, as just defined.

The characteristics of such flows, e.g., the degree of turbulence, and the associated heat transfer rates must necessarily depend on the sizes, the temperatures of the ambient fluid and the fin surfaces. The possible spacing apart size and number of the fins, the material properties, and the particular exigencies of a given application may make one or the other (or some combination) of such ambient fluid flows particularly helpful in obtaining the desired rate of transfer of heat from heat source 22 through heat sink element 26 and into the ambient fluid. Also, as persons skilled in the art may be expected to appreciate and understand, it would be a relatively simple matter to provide a plenum chamber, around and past the fins of heat sink element 26 to more precisely guide the flow of a coolant fluid into intimate contact with the surfaces of the fins. Furthermore, although only parallel planar fins are illustrated in FIG. 3, it would be a mere design expedient to provide coaxial circular fins, radially disposed fins or some other configuration of basic shapes and dispositions of fins or, to further promote turbulent flow in the regions immediately adjacent the fin surfaces, a plurality of through apertures in the fins. Such details are not essential to a proper understanding or realization of the advantages offered by the present invention and numerous such variations in fin technology are known in the art.

Figure 4:
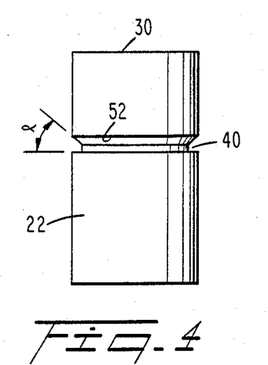
FIG. 4 is an elevation view of the cylindrical heat source of FIG. 3.

Referring now to FIG. 4, the preferred form of the present invention has a groove 40 provided a short distance from heat transmitting end surface 30 of heat source 22. This groove 40 preferably has one side face 52 inclined at a selected acute angle "$\alpha$" with respect to the orientation of heat transmitting end face 30 for reasons which will become clearer as the two-part heat sink attachment element 28a,b is described more fully hereinafter. This angle "$\alpha$" is in the range of about to 5° to 40° from the heat-transmitting end face that defines in the preferred embodiment a radial plane. A preferred value of "$\alpha$" for a copper heat source 22 and an aluminum heat sink attachment element 28a,b is about 30°.

Figure 5:
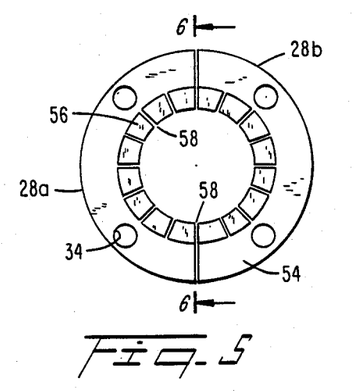
FIG. 5 is a plan view of the heat sink unit illustrated in FIG. 3, as seen from the heat source connecting end thereof.
Figure 6:
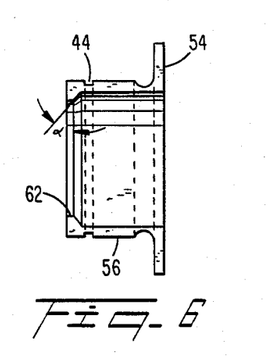
FIG. 6 is an elevation view at an axial plane of one half of the two-part heat sink unit attachment element illustrated in FIG. 5.

As best understood with reference to FIGS. 2 and 5, self-tightening heat sink attachment element 28a,b has a flat heat sink attachment base portion 54 provided with a plurality of through apertures 34 to receive, for example, conventional screws 32 therethrough. Extending from base portion 54 in a direction substantially normal thereto are castellated finger-like elements 56, with each pair of adjacent castellated elements being separated by a small radially extending gap 58. Where element 28 is formed in two parts such as 28a and 28b (or a larger number of parts), the end castellated elements 56 of each part are formed to ensure that there is at least a small gap 58 between all pairs of adjacent castellated elements, particularly when spring clip 42 is acting on them.

Close to base 54 there is on the outside of the castellated elements 56 an arcuate-section circumferential groove or recess 60, a principal purpose of which is to reduce the cross-sectional area of the castellated elements 56 thereat and to make their connection with respect to base 54 more flexible than would be the case without groove 60. Spring clip 42 must be sized and shaped to exert a desired amount of force on each castellated element 56 to flexibly deform it a little into forcible contact with the heat source.

Each castellated section 56 extends to a length such that a tooth 62 formed at the distal end thereof can extend radially inwardly into groove 52 of heat source 22 when the assembly is put together. Each tooth 62 is formed to have a sloping face 64 inclined to be at the same acute angle "$\alpha$" with respect to the planar face of base 54. Finally, adjacent the distal ends bearing teeth 62, the castellated elements 56 are formed to each have an outside circumferential groove 44 that is intended to receive spring clip 42.

Figure 7:
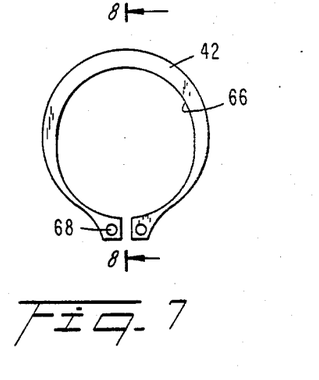
FIG. 7 is a plan view of a commercially available spring clip element of a type suitable for use in the preferred embodiment of this invention.
Figure 8:
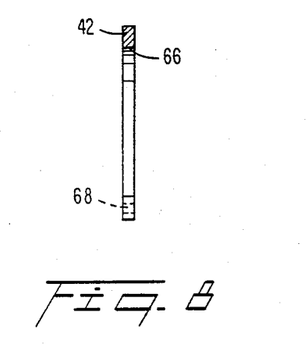
FIG. 8 is a vertical cross-sectional view at section 8—8 of the spring clip illustrated in FIG. 7.

As is readily seen from FIGS. 7 and 8, a suitable spring clip 42 is symmetric about a line passing though its narrow end gap (readily identified as section I—I) and has an inside split circumferential surface 66 which, when in place in groove 44, will press on castellated pieces 56 radially inward with a force and to an extent determined by the relative strengths of the materials of spring clip 42 and heat sink attachment element 28a,b as well as the specific geometries of these elements. In practice, temporarily by attaching small wires (not shown) to apertures 68 provided at the split ends of spring clip 42, a user of the ring can pull the ends apart and spring clip 42 over the distal ends of castellated elements 56 so that the ring can be comfortably located in groove 44. It is, therefore, implicit that groove 44, in the axial direction at least, is wide enough to readily accommodate the thickness "T" of spring clip 42. Also, the base diameter of groove 44 must be somewhat larger than the inside diameter "D" of inner surface 66 of ring 42 for the apparatus to perform as intended. The inside longitudinal sides of castellated elements 56 should not touch heat source 22 during use.

Having thus described the geometries and particular features of various elements that combine together in the preferred embodiment of this invention, it is helpful to review a preferred technique of how the assembly is put together and why it performs as intended.

A suitably sized spring clip 42, such as a split ring of the type which is commercially available from Waldes Kohinoor, Inc. of Long Island, New York, under the name "Waldes Truarc" external series 5100, is first slipped around heat source 22 and into grooves 44 of the piece 28a or 28b. Then, utilizing the geometries described hitherto, one of the two heat sink element attachment pieces 28a or 28b is screwed into place to base 36 of heat sink element 26. This partial assembly is then placed so that the teeth 62 are located inside groove 40 of heat source 22. The other half of the heat sink attachment element 28a or 28b (as the case may be) is then screwed into place to face 36 of heat sink element 26 with its respective teeth 62 also in place in groove 40 on the other side from the previously attached element and with spring clip 42 in its grooves 44. When using a split ring, as described above, by hooking or otherwise attaching wires to apertures 68, a user may open up spring clip 42 so that it may be slipped over the distal ends of castellated segments 56 and may be put into place inside grooves 44.

As persons skilled in the mechanical arts will immediately appreciate, the presence of a radially directed inward force adjacent the distal ends of castellated segments 56 flexibly mounted on base 54 will cause there to be a radially directed inward force applied by face 64 of each of teeth 62 to the comparably sloping grooved surface 52 of groove 40 in heat source 22. As a direct result of this, taking into account all the castellated segments 56, there will be a resultant axially directed force of compression between heat transmitting end surface 30 of heat source 22 and the corresponding receiving surface 38 of heat sink 26. Therefore, depending on how compatibly shaped and smooth the two heat conduction surfaces 30 and 38 are, there will be a thermally conductive contact therebetween.

There is available technical literature relating to the type and nature of thermally conductive contacts obtainable between two adjacent contacting surfaces. An example of this is a book titled *Cooling of Electronic Equipment*, by Alan W. Scott, published by John Wiley & Sons. Section 2.5, titled "Mounting Interfaces" of this book is of particular interest in the present context. FIGS. 2.8 and 2.10 from this known source of relevant technical information make it clear that if two elements make contact at their respective contact surfaces, actual physical contact is limited to relatively small areas with numerous voids formed and present between the contacting surfaces and that with smoother surfaces there are more numerous contact areas. As a consequence, the smoother the contacting surface are, the more such areas of contact and the better the rate at which conductive heat transfer can take place for a given temperature difference therebetween. Note also that if the surfaces are smoother, then any voids present therebetween are smaller, which cannot but help heat transfer between the two contacting elements even by local convection or radiation therebetween. Also, unless the two surfaces that are intended to make contact are both similarly formed, e.g., both nominally flat planar surfaces or surfaces having, for example, the same radius of curvature, there may well develop substantial gaps therebetween. A foreseeable consequence of such separation between nominally contacting surfaces is that heat conduction between them will be reduced for a given nominal area at which these surfaces are intended to make contact.

With the application of an external force directed substantially normal to the nominal planar extent of the contacting surfaces, possibly with local deformation to an extent dependent upon the hardness of the materials of which the elements are made, there is an increased surface area for conductive heat transfer formed of probably larger local contact zones having a greater total surface area than was possible with limited contact at relatively smaller area contact points. In other words, by the application of an external force tending to forcibly bring the two contacting surfaces closer together, it is possible to increase that proportion of nominal contact area at which actual thermally conductive physical contact occurs. Obviously, therefore, it is highly desirable to generate and maintain a compressive force tending to bring together the two contacting surfaces across which conductive heat transfer is desired.

There exists a class of materials generically referred to as "heat sink compounds", that at room temperature have the consistency of a heavy grease, that are thermally conductive to an extent and are squeezable between surfaces urged into forcible contact with each other. Typically, a small amount of the heat sink compound is applied to one of the forcibly contacting surfaces and the coming together of these surfaces squeezes out surplus heat sink compound, leaving only a very small amount between the contacting surfaces that when forced together make direct and actual contact at their local high points within the nominal contact area. With proper use of such a heat sink compound, conductive heat transfer between elements takes place across physical contact points, the number of which generally is controllable by the smoothness of the contacting surfaces and the size and number of which is controllable by the application of a force squeezing the contacting surfaces together, as well as across the relatively thin zones filled with the thermally conductive heat sink compound. However, if the nominal heat transfer surfaces are separated by so much heat sink compound that there are few or none of the actual physical contact points and, particularly, if there are in fact voids formed in applying the heat sink compound to the zone between the nominally contacting surfaces, then there is a serious dropoff in the rate at which conductive heat transfer can take place between the elements.

It is pointed out in the previously cited book by Scott, at Section 2.5 thereof, that the total amount of area attributable to physical contact points may be less than 1 percent of the total nominal contacting surface area and that, unless great care is taken to maximize such actual contact area, the temperature difference required merely to conduct heat across such an interface may be as high as that which is required to conduct heat through several inches thickness of a metal used to form the heat sink. This reference also points out that to minimize the temperature difference required across such an interface between two contacting surfaces, it is helpful to: (a) improve the surface finish of the heat sink and the contacting heat source; (b) apply substantial clamping pressures or compressive force to force the heat sink to the heat source; (c) solder the heat sink heat receiving surface directly to the heat transmitting surface of the heat source (a technique that is not always acceptable); and, (d) use a heat sink compound in suitable amounts between the contacting surfaces of the heat sink and the heat source.

FIG. 2.9 of the Scott reference illustrates the extent to which surface finish affects the variation of thermal resistance per unit area as a function of the nominal contact pressure, for materials such as steel and aluminum. Similarly, FIG. 2.11 of the Scott reference serves to illustrate the variation of thermal resistance across an interface with and without a typical heat sink compound as a function of a torque applied to a mechanism to drive together the two surfaces at an interface. Essentially, these Figures illustrate that aluminum permits a greater rate of heat transfer at all contact pressure levels than does steel, that a more polished surface improves the rate at which heat is transferred per nominal unit area of an interface, and that the presence of a suitable amount of heat sink compound also facilitates heat transfer.

Appreciation of the advantages realizable from use of the present invention will be gained from the following examples and analyses.

EXAMPLE 1

Given a 1.4" diameter nominal contact interface area between a heat sink unit and a heat source, with both surfaces polished to a 65 u in finish, what will be the influence of contact pressure (total compressive force holding the heat sink in contact with the heat source/nominal interface area) on the temperature difference across the interface for a 500 watt power dissipation?

Solution 1:  $Q = 500$ (watts)
$A = \pi/4 \times (1.4)^2 = 1.539$ (in$^2$)
$Q/A = 500/1.539 = 324.8$ (watts/in$^2$)

| CONTACT PRESSURE (psi) | THERMAL RESISTANCE (°C. per watt/in$^2$) | THERMAL DROP (°C.) |
|---|---|---|
| 0 | 0.40 | 129.9 |
| 50 | 0.27 | 87.7 |
| 100 | 0.21 | 58.2 |
| 150 | 0.17 | 55.2 |

Thermal drop = thermal resistance x Q/A, i.e., thermal resistance multiplied by 324.8 (watts/in$^2$) as computed above.

This example shows that by maintaining a contact at 150 (psi) rather than at 50 (psi) pressure, the temperature drop across the interface is reduced from 87.7° C. to 55.2° C.; a 32.5° C. reduction. This reduction can be significant in a solid state cooling application, since the ambient temperature may not always be reducible and the heat source temperature may be relatively high. Also, as persons skilled in the art will appreciate, even if a 150 (psi) pressure were provided initially any drop thereof due to thermal cycling, mechanical disturbances or the like, as could happen with known techniques, could allow overheating of and damage to the heat source.

Where an aluminum heat sink element is attached to, for example, a copper heat source according to this invention by an aluminum attachment element 28, the heat sink is held ever more firmly to the heat source. Various tests have been performed with such a heat sink element cooling a klystron, with airflow directed parallel to the heat sink fins (transverse airflow) and with airflow directed toward the heat sink fin ends (axial airflow). The thermal resistance of the self-tightening heat sink as taught herein for the 1.4" diameter heat exchanger area was found to be:

$$\Omega = \frac{1}{28.5 \text{ (watts/°C.)} \times \pi/4 \times (1.4)^2}$$
$$= 0.023° \text{ C./(watts/in}^2),$$

at 500 watts dissipation.

The 0.023° C./(watt/in$^2$) value implies that the experimental cooler had a corresponding contact pressure exceeding 250 psi.

The 0.023° C.(watt/in$^2$) value also implies a 4:1 reduction in thermal resistance for a highly squeezed heat sink mount with a heat sink compound.

This self-tightening design clearly offers a definite improvement in the thermal interface (lower temperature drop across the same) over the present state-of-the-art attachment means.

EXAMPLE 2 (Transverse Airflow)

Figure 9:
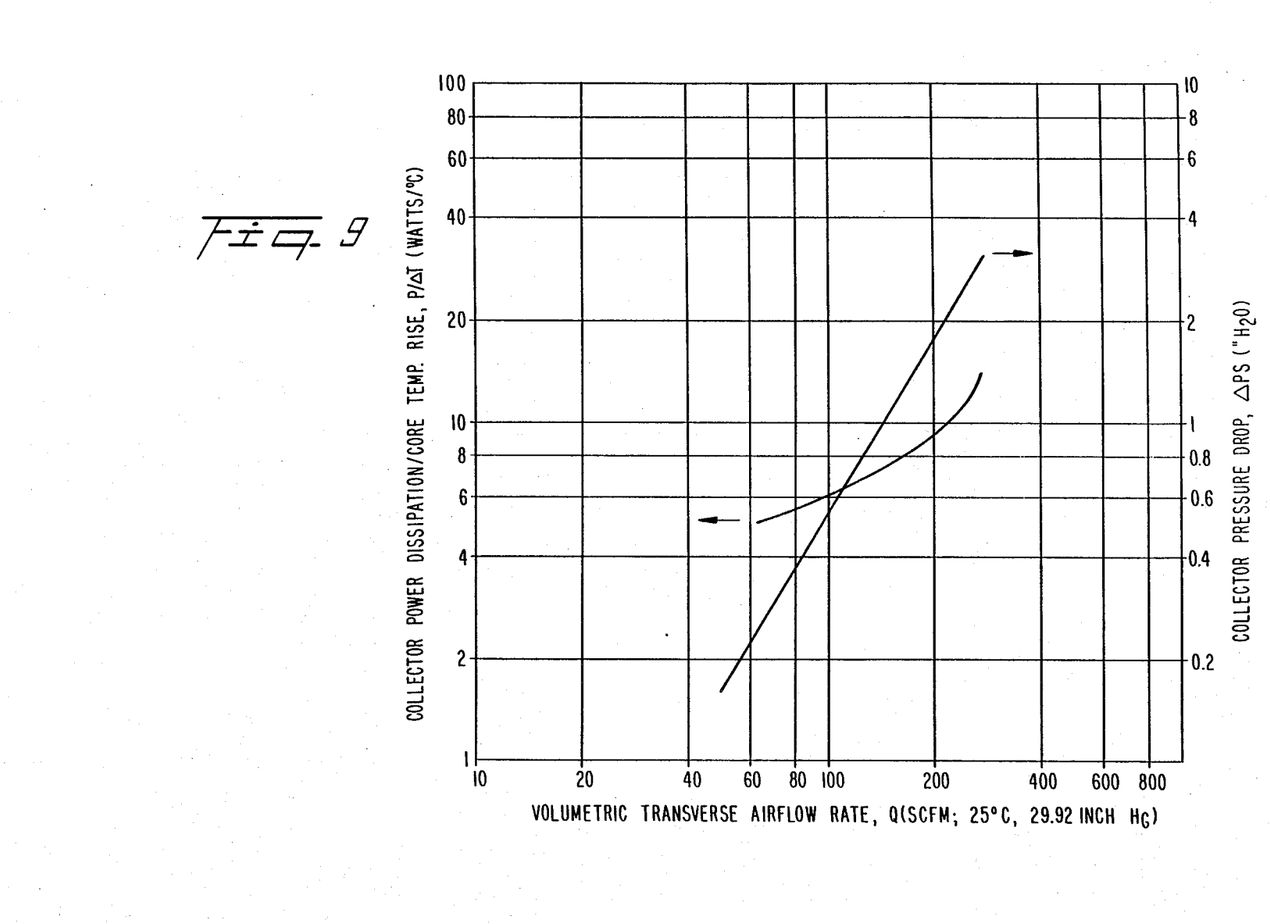
FIG. 9 presents graphs on a log-log scale of klystron collector power dissipation variation and core temperature rise as a function of volumetric air flow rate as well as collector pressure drop as a function of volumetric air flow rate with axial air flow over the heat sink element of FIG. 3.

FIG. 9 is the normalized application information for the proposed klystron cooler design for transverse airflow directed at the heat sink fins.

Assume, for example, that one wants to dissipate 500 watts with the contact interface not exceeding 90° C., assuming that the maximum cooling inlet air does not exceed 50° C. (122° F.). What is the required airflow rate?

Solution 2

$$\frac{P}{\Delta T} = \frac{500}{(99 - 50)} = 10.2 \text{ (watts/°C.)}$$

Now, from FIG. 9, $$\frac{P}{\Delta T} = 10.2 \text{ (watt/°C.)} = 215 \text{ SCFM at } 2.05 \text{ "H}_2\text{O}$$

Next, correcting for 50° C. inlet temperature, the air density ratio is:

$$C = 1.084.$$

This means that air at standard atmospheric conditions has a density 1.084 times that which it has at 50° C. The hot air (50° C.) cooling requirement is:

$$Q 215 \times 1.084 = 233 \text{ CFM}$$

and $$\Delta P = 2.04 \times 1.084 = 2.22 \text{"H}_2\text{O}.$$

The design goal was 275 CFM at 2.0"H$_2$O.

This test effort was to determine how close the first design was to meeting the system requirements. Airflow was transverse of the cooler, i.e., perpendicular to the collector axis.

A second series of tests was conducted with airflow directed axially to the finned heat sink element. The thermal conductance values were again determined and are presented in FIG. 10.

Figure 10:
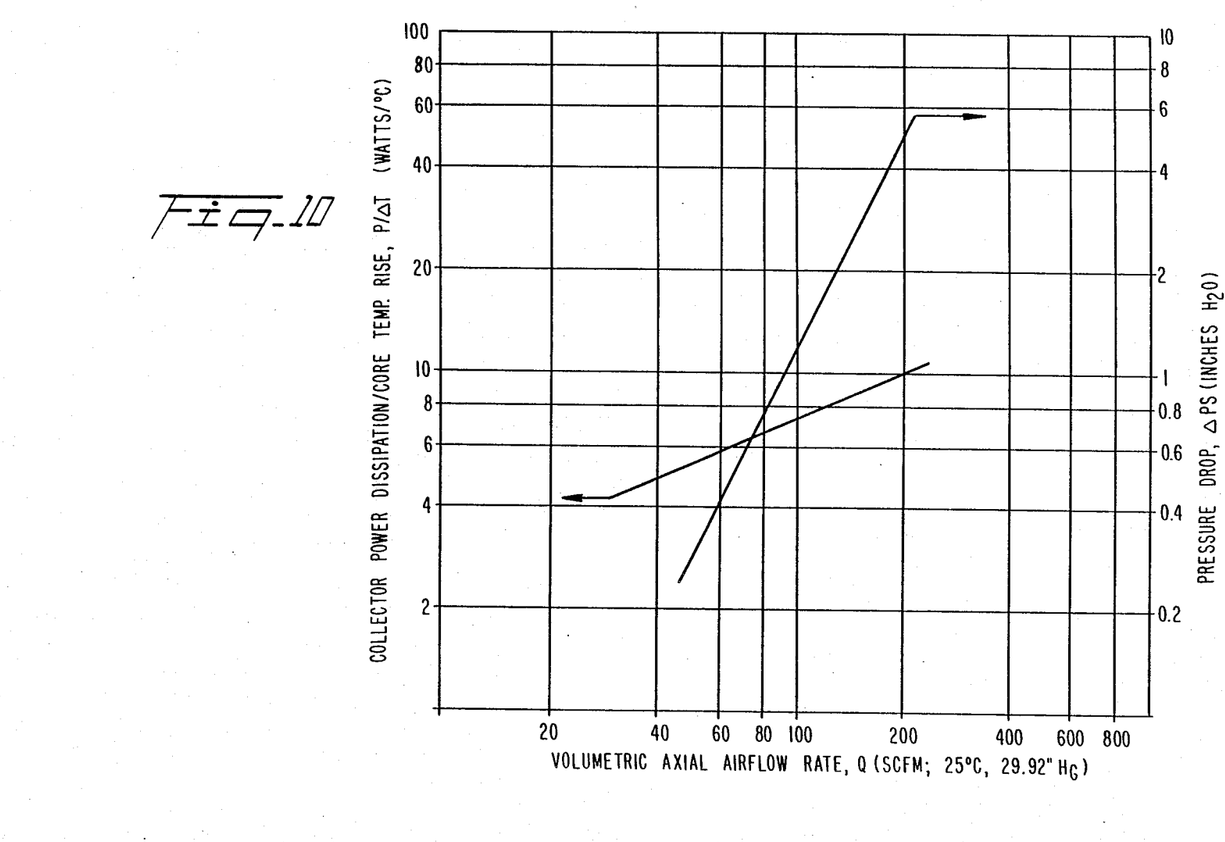
FIG. 10 is a graph on a log-log scale of the variation of a klystron collector power dissipation and core temperature rise as a function of volumetric air flow rate as well as collector pressure drop as a function of volumetric air flow rate with transverse air flow over the heat sink element of FIG. 3.

FIG. 10 shows the heat transfer (P/ΔT) and the pressure drop characteristics when cooling of the self-tightening heat sink unit is with axial airflow. The back pressure for the axial airflow is twice that, at comparable airflows, of the transverse airflow configuration. The P/T curve, however, is comparable. These data imply that axial airflow ducting is a viable configuration.

EXAMPLE 3

Figure 11:
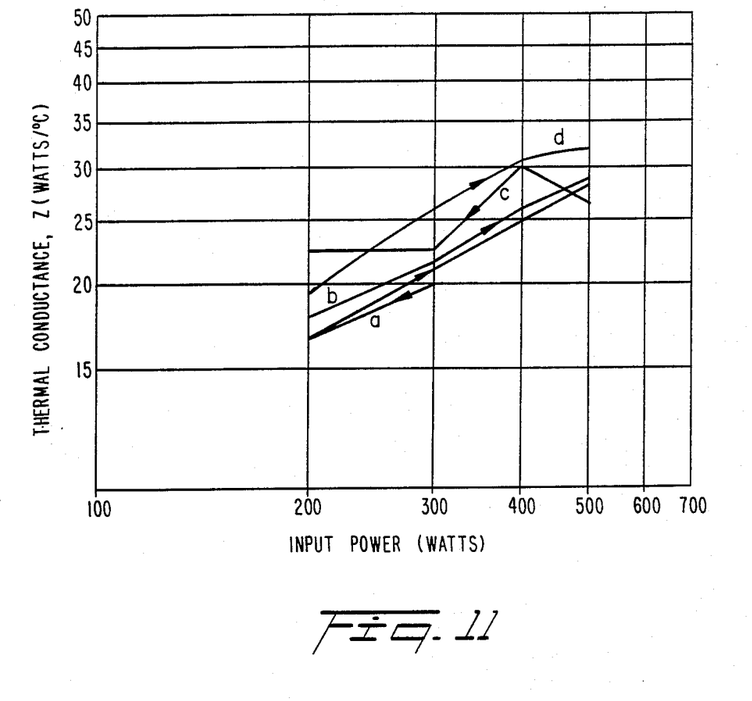
FIG. 11 is a graph on a log-log scale of experimental data related to the variation of thermal conductance with input power for heat transfer across a 1.4" diameter circle resulting from thermal cycling of the structure.

Given that a 1"H$_2$O pressure drop for axial airflow through the cooling fins is available. This head loss corresponds to a flow rate of 94 CFM (see FIG. 11).
With 94 CFM, P/Δ T=7.1 (watts/° C.) (FIG. 11).
With P=500 (watts) anode dissipation, $$500/\Delta T = 7.1,$$

$$\Delta T = 70° C.$$

With inlet air at a temperature less than 29° C., the fin surface temperature is less than:

$$T_{surface} = 70 + 29 = 99° C.,$$

an acceptable value.

A comparable calculation shows that the same cooler, but with transverse airflow, will operate at 1"H$_2$O and 29° C. inlet air with a 92° C. surface.

As the above example computations based on experimental data illustrate, the heat sink element attachment according to the present invention provides a viable solution to the problem of ensuring effective cooling of a heat source by conductive transfer of heat therefrom to a heat sink element.

In general, each individual test sequence in experimental study of the preferred embodiment of the invention showed the thermal conductance improving for two situations: first, by an increase in system power dissipation and, second, with each successive thermal cycle.

FIG. 10 presents such experimental data obtained by the inventors. Each series of data are connected by a line. These data show that each increase in power improves the thermal conductance and a decrease in power (e.g., per line c) reduces the conductance. FIG. 10 also demonstrates that each time the thermal dissipation device was turned on (sequence a, b, c, d) the thermal conductance improved.

It should be apparent from the preceding that the invention may be practiced otherwise than as specifically described and disclosed herein. Modifications may, therefore, be made to the specific embodiments described hereinabove without departing from the scope of the present invention, and are intended to be included within the claims appended hereinbelow.

What is claimed is:

1. A self-tightening heat sink unit, attachable to a correspondingly formed heat transfer portion of a hot body to conductively receive heat therefrom, comprising:
   a heat sink element having a first surface for making thermally conductive forcible contact thereat with a corresponding first contact surface of said heat transfer portion of said hot body to receive heat therefrom;
   contact forcing means for providing said forcible contact between said heat sink element and said hot body under the action of a compressive force acting between said heat sink element first surface and said hot body first contact surface, wherein said contact forcing means also continually acts during use of the heat sink unit to promote an increase in said compressive force to thereby enhance conductive heat transfer from the hot body to the heat sink element;
   said contact forcing means comprising at least one connector element attachable to said heat sink element and forcibly engageable with a connector contacting portion of said hot body; and
   said contact forcing means further comprising tightening means for coacting with said at least one connector element and continually acting during use of said heat sink unit to increase a force of engagement between a hot-body-contacting portion of said connector element and said connector-contacting portion of said hot body.

2. The heat sink unit according to claim 1, wherein:
   said tightening means comprises an elastic element locatable in a predetermined disposition with respect to said at least one connector element to apply thereto a continual force that generates said force of engagement as a resultant thereof.

3. The heat sink unit according to claim 2, wherein:
   said at least one connector element has a surface which is engageable with said connector-contacting portion of said hot body, said connector element surface being inclined at a predetermined acute angle with respect to said hot body first contact surface.

4. The heat sink unit according to claim 3, wherein:
   said at least one connector element has at least one tooth element comprising said inclined surface engageable with a groove in said hot body.

5. The heat sink unit according to claim 1, wherein:
   said heat sink element comprises a first material having high thermal conductivity to facilitate heat transfer thereto from said hot body.

6. The heat sink unit according to claim 5, wherein:
   said first material is aluminum.

7. The heat sink unit according to claim 1, wherein:
   said heat sink element is formed to have an extended surface area to facilitate heat transfer therefrom to the ambient atmosphere as heat is transferred from said hot body to said heat sink element.

8. The heat sink unit according to claim 7, wherein:
   said extended surface area comprises a plurality of fin elements.

9. The heat sink unit according to claim 1, wherein:
   said heat sink element first surface is formed to a predetermined smoothness.

10. The heat sink unit according to claim 9, wherein:
    said predetermined smoothness is matched to the smoothness of said first hot body contact surface.

11. The heat sink unit according to claim 1, further comprising:
    a quantity of a thermally conductive material disposed on said heat sink element first surface to facilitate heat transfer.

12. The heat sink unit according to claim 10, wherein:
    said heat sink element first surface and said hot body first contact surface are both flat.

13. The heat sink unit according to claim 3, wherein:
    said predetermined acute angle is in the range of 5° to 40° as measured with respect to the hot body contact surface.

14. A self-tightening heat sink unit, attachable to a correspondingly formed heat transfer portion of a hot body to conducively receive heat therefrom, comprising:
- a heat sink element having a first surface for making thermally conductive forcible contact thereat with a corresponding first contact surface of said heat transfer portion of said hot body to receive heat therefrom;
- contact forcing means for providing said forcible contact between said heat sink element and said hot body under the action of a compressive force acting between said heat sink element first surface and said hot body first contact surface, wherein said contact forcing means also continually acts during use of the heat sink unit to promote an increase in said compressive force to thereby enhance conductive heat transfer from the hot body to the heat sink element;
- said contact forcing means comprising at least one connector element attachable to said heat sink element and forcibly engageable with a connector contacting portion of said hot body; and
- each said at least one connector element has a plurality of elastically attached extensions depending substantially normally with respect to said heat sink element first surface, each of said extensions being formed at a distal end thereof as a tooth engageable with a connector-contacting portion of said hot body at a surface thereof inclined at a predetermined acute angle with respect to said heat sink element first contact surface.

15. A self-tightening attachment for contacting a heat receiving surface of a heat sink element to a corresponding heat transmitting surface of a heat source to effect conductive heat transfer therebetween in a manner that can only increase a first contact force between these heat transfer surfaces when the attachment is subjected to in-use experiences including thermal cycling, extraneous mechanical vibrations and the like, comprising a heat sink element having:
- a first end portion, attached to said heat sink element outside said heat receiving surface thereof;
- an intermediate portion, elastically attached to said first end portion and extending in a direction substantially normal to said first end portion toward an attachment portion of said heat source;
- a second end portion, connected to said intermediate portion and formed to contact an attachment portion of said heat source at a surface thereof that is inclined at a predetermined acute angle with respect to said heat transmitting surface of said heat source; and
- self-tightening means disposed for continually applying a tightening force to said intermediate portion, whereby when said heat sink element is attached to said heat source said second end portion maintains a second contact force at said inclined surface and as a resultant thereof irreducibly generates said first contact force holding said heat receiving and heat transmitting surfaces in mutual thermally conducive contact.

16. The self-tightening attachment according to claim 15, further comprising:
- connection means for connecting said first end portion to said heat sink element.

17. The self-tightening attachment according to claim 15, wherein:
- said self-tightening means comprises a split ring sized, shaped and disposed to apply at least a predetermined tightening force at a selected location on said intermediate portion.

18. The self-tightening attachment of claim 17, wherein:
- said self-tightening means comprises only nonmagnetic material.

19. The self-tightening attachment of claim 18, wherein:
- said nonmagnetic material comprises aluminum.

20. The self-tightening attachment of claim 15, wherein:
- said end portion is formed as a tooth having a face inclined at said acute angle with respect to heat receiving and transmitting surfaces during use of the self-tightening attachment.

21. The self-tightening attachment of claim 15, wherein:
- said predetermined acute angle is in the range of 5° to 40° as measured in respect to the hot body contact surface.

22. The self-tightening attachment of claim 15, wherein:
- said predetermined acute angle is approximately 30°.

* * * * *